United States Patent
Kashima

[19]

[11] Patent Number: 5,890,060
[45] Date of Patent: Mar. 30, 1999

[54] MICRO-WAVE MIXING CIRCUIT AND DOWN-FLOW CONVERTER USING THE SAME

[75] Inventor: Yukiro Kashima, Takatsuki, Japan

[73] Assignee: Matsushita Electric Industrial Co., Ltd., Kadoma, Japan

[21] Appl. No.: 932,883

[22] Filed: Sep. 18, 1997

[30] Foreign Application Priority Data

Sep. 19, 1996 [JP] Japan .................................... 8-247359

[51] Int. Cl.⁶ ...................................................... H04B 1/26
[52] U.S. Cl. ...................... 455/323; 455/330; 455/327; 333/21 R; 333/104; 333/116
[58] Field of Search .................................. 455/323, 330, 455/325, 326, 327, 333, 324, 334, 337, 338, 296, 319, 310, 317; 333/116, 128, 26, 21 A, 104, 21 R

[56] References Cited

U.S. PATENT DOCUMENTS

| | | | |
|---|---|---|---|
| 5,153,469 | 10/1992 | Petted et al. | 455/326 |
| 5,446,923 | 8/1995 | Martinson et al. | 455/330 |
| 5,471,664 | 11/1995 | Kim | 455/327 |
| 5,754,951 | 5/1998 | Kashima et al. | 455/330 |

FOREIGN PATENT DOCUMENTS

| | | |
|---|---|---|
| 0 317 642 | 5/1989 | European Pat. Off. . |
| 0 713 288 | 5/1996 | European Pat. Off. . |
| 57-065903 | 4/1982 | Japan . |
| 7-211969 | 8/1995 | Japan . |

OTHER PUBLICATIONS

Henry H. Cross, "Automatic Bias Circuit for Mixers", Microwave Journal, vol. 26, No. 5, May 1983.
European Search Report for Int'l Appln No. EP 97 11 6149, dated 21 Nov. 1997.

*Primary Examiner*—Reinhard J. Eisenzopf
*Assistant Examiner*—Doris To

[57] ABSTRACT

A micro-wave mixing circuit produces producing a stable frequency conversion characteristic against a dispersion of output voltage of a local oscillation signal tapped off from a local oscillator. A micro-wave signal fed into a micro-wave signal input can be converted into an intermediate frequency signal of 1 GHz bandwidth where a stable frequency conversion characteristic is maintained against a dispersion of an output voltage of a local oscillation signal, by supplying bias current from a bias supply circuit to an anode of a Schotkky barrier diode responsive to a local oscillation output which is supplied from a local oscillator.

6 Claims, 3 Drawing Sheets

MICRO-WAVE MIXING CIRCUIT AND DOWN-FLOW CONVERTER USING THE SAME

FIELD OF THE INVENTION

The present invention relates to a micro-wave mixing circuit used in a down-flow converter for satellite communication or satellite broadcasting.

BACKGROUND OF THE INVENTION

As the satellite broadcasting becomes popular, (CS) communication satellite broadcasting which uses a communication satellite is now commercially available. Thus, an ordinary house has more opportunities to receive broadcasting from plural satellites. A receiving antenna which is smaller in size and lower at cost is therefore desirable.

FIG. 3 depicts a conventional micro-wave mixing circuit and an intermediate frequency amplifier. A micro-wave signal having a 12 GHz bandwidth fed into a micro-wave signal input part 1 and a local oscillation signal (e.g. 10.678 GHz), supplied from a local oscillator 2 via a band pass filter 3 (BPF), are mixed by a frequency converting diode, such as Schottky barrier diode 5 (SBD). SBD 5 is coupled to a micro strip line 4 (MSL), and then the mixed signal is converted into an intermediate frequency signal having a 1 GHz bandwidth.

When a local oscillation signal voltage at SBD 5 is less than an expected value, loss due to frequency conversion is increased. In order to prevent the frequency conversion loss from being increased, a bias voltage is applied to the frequency converting diode. In order to produce this bias voltage, a specified bias control voltage is applied to a bias current supply terminal 6.

The intermediate frequency signal passed through a low pass filter 7 (LPF) is amplified by intermediate frequency amplifiers 8 and 9, and then tapped off from an intermediate frequency signal output part 10.

However, according to the above structure, the local oscillation signal voltage is not constant but varies widely due to individual frequency characteristics of each device (e.g. metal semiconductor [MESEFT]) used in the local oscillator 2 and also dispersion caused by mounting those devices.

Thus, a rectifying voltage of the local oscillation signal voltage of SBD 5 has a dispersion responsive to the dispersion of the local oscillation signal voltage applied to SBD 5. As a result, even if a constant bias control voltage is applied to the bias supply terminal 6, the bias current traveling through SBD 5 does not become an expected value, but generates a wider dispersion. Accordingly, it is very difficult to obtain a certain level of performance from the conventional micro-wave mixing circuit when volume production thereof has been started.

SUMMARY OF THE INVENTION

A micro-wave mixing circuit of the present invention applies a bias current to SBD 5 responding to an output voltage of the local oscillation signal, thereby narrowing the dispersion of conversion loss due to mixing.

To be more specific, the micro-wave mixing circuit comprises;

(a) a micro-wave signal input part formed on a dielectric substrate with a micro strip line (MSL), SBD 5 of which anode is coupled to a terminal of the above MSL, and of which cathode is grounded, and
a bias supply circuit.

The above bias supply circuit includes a bias current supply terminal which applies a bias voltage to an anode of a mixer diode, and a detection terminal which detects a dc voltage generated at the anode. The bias supply circuit applies a bias control voltage to the bias supply terminal which supplies bias current responding to a dc voltage generated at the detection terminal.

Even if an output voltage of a local oscillation signal which is supplied from the local oscillator has a dispersion, conversion loss due to the mixing can be reduced to a small value by applying the bias current responding to the dc voltage to the anode of SBD 5.

The present invention addresses the problems which the conventional micro-wave mixing circuit has, and provides a micro-wave mixing circuit as well as a down-flow converter with a smaller dispersion and at an inexpensive cost.

PREFERRED EXEMPLARY EMBODIMENTS

Exemplary Embodiment 1

Figure 1:
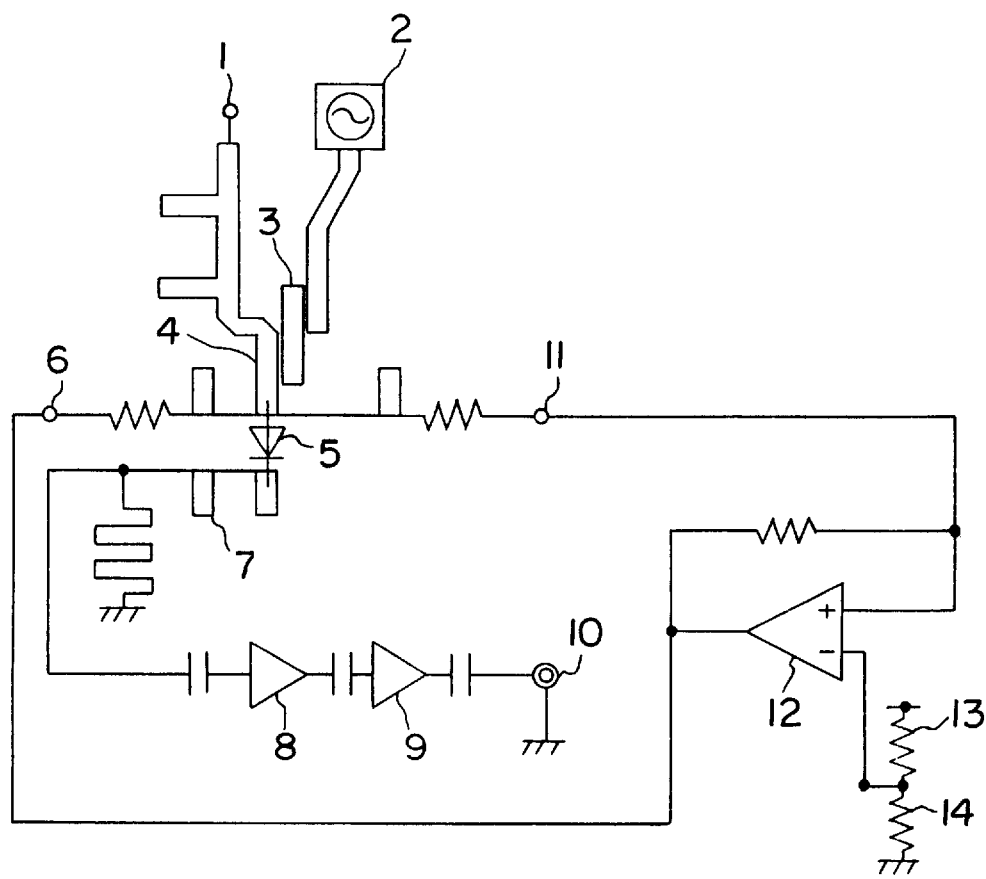
FIG. 1 is a circuit pattern of a micro-wave mixing circuit used in Exemplary Embodiment 1 of the present invention.

FIG. 1 is a circuit pattern of a micro-wave mixing circuit used in Exemplary Embodiment 1 of the present invention. The circuit comprises the components below:

a micro-wave signal input part 1, a local oscillator 2, BPF 3 for passing a local oscillation frequency, MSL 4, SVD 5, a bias current supply terminal 6 which supplies bias current to SVD 5, LPF 7 for passing an intermediate frequency, an intermediate amplifiers 8 and 9, an output part 10 of the intermediate frequency signal, a detection terminal 11 for detecting a dc voltage generated at SBD 5, a bias supply circuit 12 comprising a computation circuit, resistors 13 and 14 for dividing a supply voltage (not shown in FIG. 1).

The divided voltage is applied to a lead of an input terminal of the bias supply circuit as a predetermined reference voltage, thereby minimizing the conversion loss at SBD 5.

The micro-wave mixing circuit and the intermediate frequency amplifier so structured as above are now detailed in their operation.

A micro-wave signal having a 12 GHz bandwidth, for example, is fed into the micro-wave signal input part 1 and a local oscillation signal (e.g. 10.678 GHz) supplied from the local oscillator 2 via BPF 3 travel together to MSL 4.

On the anode of SBD 5 which is coupled to MSL 4, a dc voltage is produced by the following two factors:

a dc voltage generated by an applied voltage from the bias current supply terminal 6, and a dc voltage generated by being rectified by the local oscillation signal supplied from the local oscillator 2

The produced dc voltage is detected by the detection terminal 11 as a detection voltage.

The bias supply circuit 12 compares the detection voltage with the reference voltage, and then applies a bias control voltage to the bias current supply terminal 6.

The bias supply circuit 12 is thus controlled so that the detection voltage may become equal to the reference voltage.

Therefore, SBD 5 is not influenced by a of the output voltage of the local oscillation signal supplied from the local oscillator 2. As a result, conversion loss is maintained at a reasonable level. The micro-wave signal, which is converted by SBD 5 into the intermediate frequency signal having a 1 GHz bandwidth, for example, passes through LPF 7, and is then amplified to a desirable level by the intermediate amplifiers 8 and 9. Finally, the micro-wave signal is tapped off from the intermediate frequency signal output part 10.

Exemplary Embodiment 2

Figure 2:
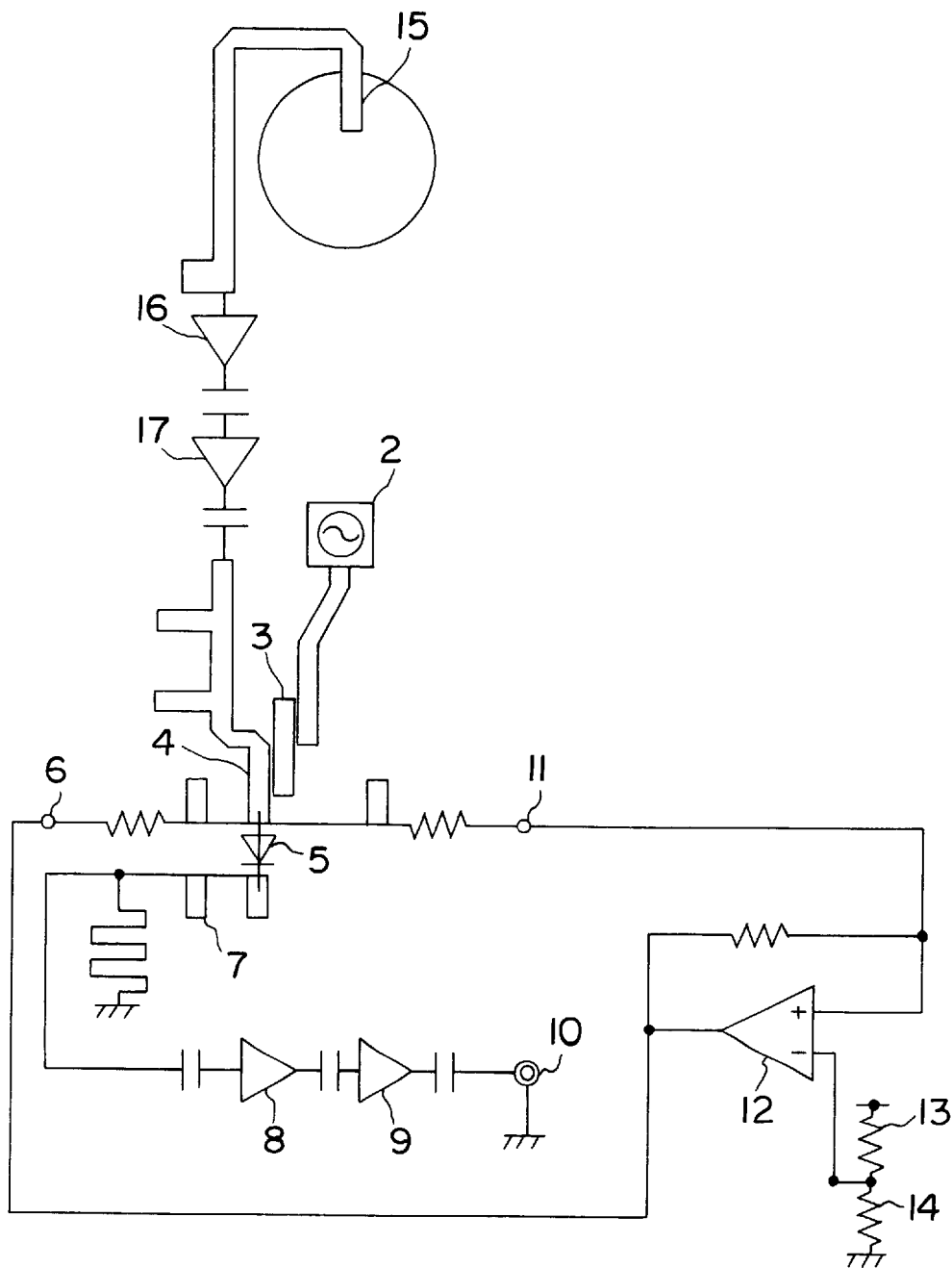
FIG. 2 is a circuit pattern of a down-flow converter incorporating a micro-wave mixing circuit which is used in Exemplary Embodiment 1.
Figure 3:
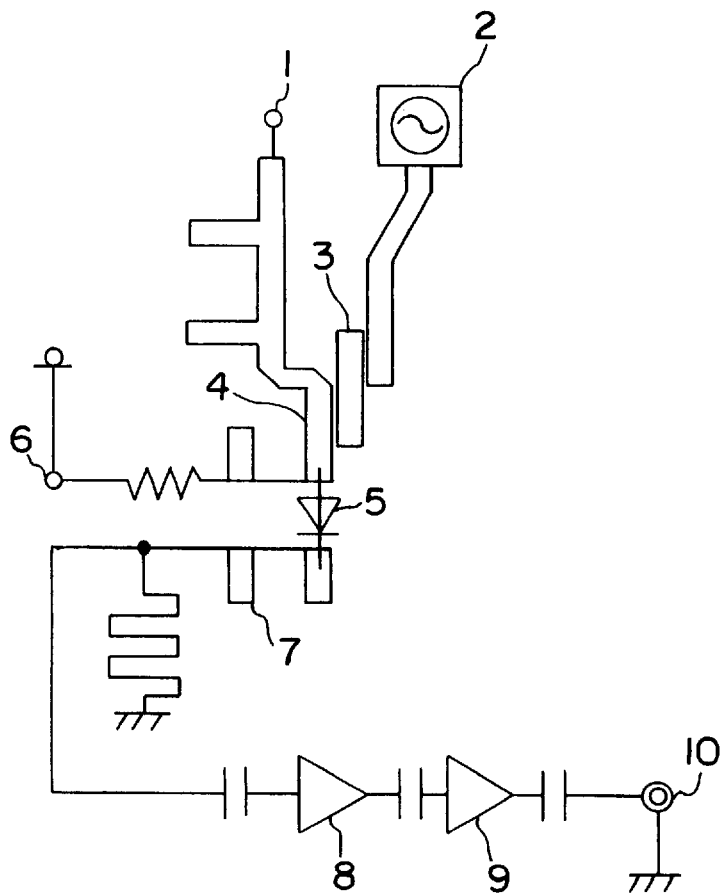
FIG. 3 is a circuit pattern of a conventional micro-wave mixing circuit.

FIG. 2 is a circuit pattern of a down-flow converter incorporating a micro-wave mixing circuit which is used in Exemplary Embodiment 1.

A probe 15 converts a micro-wave signal having a 12 GHz bandwidth, for example, radiated from a satellite into a quasi transverse electromagnetic (TEM) wave. Low noise amplifiers 16 and 17 comprise low noise elements such as high electron mobility transistors. BPF 3 passes a local oscillation frequency. MSL 4 and SBD 5 are the same as in FIG. 1. A bias current supply terminal 6 applies a bias current to SBD 5. LPF 7 passes an intermediate frequency signal. Other elements included in FIG. 2 are intermediate amplifiers 8 and 9, an intermediate frequency signal output part 10, a detection terminal 11 for detecting dc current generated at SBD 5, a bias supply circuit 12 comprising a computation circuit, resistors 13 and 14 which divide a supply voltage (not shown in FIG. 2). The divided voltage is applied to a lead of an input terminal of the bias supply circuit as a predetermined reference voltage, thereby minimizing a conversion loss at SBD 5.

The down flow converter thus structured as above is now detailed in its operation.

The micro-wave signal radiated from the satellite is converted by the probe 15 into the quasi TEM wave which can travel through a micro strip line. The micro-wave signal is amplified by the low noise amplifiers 16 and 17. The amplified micro-wave signal and the local oscillation signal (e.g. 10.678 GHz) travel together to MSL 4.

On the anode of SBD 5 which is coupled to MSL 4, a dc voltage is produced by the following two factors:
  a dc voltage generated by an applied voltage from the bias current supply terminal 6, and
  a dc voltage generated by being rectified by the local oscillation
  signal supplied from the local oscillator 2

The produced dc voltage is detected by the detection terminal 11 as a detection voltage.

The bias supply circuit 12 compares the detection voltage with the reference voltage, and then applies a bias control voltage to the bias current supply terminal 6.

The bias supply circuit 12 is thus controlled so that the detection voltage may become equal to the reference voltage.

Therefore, SBD 5 is not influenced by a dispersion of the output voltage of the local oscillation signal supplied from the local oscillator 2. As a result, conversion loss is maintained at a reasonable level. The micro-wave signal, which is converted by SBD 5 into the intermediate frequency signal having a 1 GHz bandwidth, for example, passes through LPF 7, and is then amplified to a desirable level by the intermediate amplifiers 8 and 9. Finally, the micro-wave signal is tapped off from the intermediate frequency signal output part 10.

According to the present invention, the following three elements are added to the conventional micro-wave mixing circuit: (1) the detection terminal which detects the dc voltage generated at the anode, (2) the bias current supply terminal with which the bias current is applied to the anode of SBD 5, (3) the bias supply circuit which supplies the bias control voltage to the bias current supply terminal responding to the dc voltage generated at the detection terminal. As a result, the present invention realizes an inexpensive and a small size micro-wave mixing circuit as well as a down flow converter both of which have stable characteristics against a dispersion of the local oscillation output tapped off from the local oscillator.

What is claimed is:

1. A micro-wave mixing circuit for use with a micro-wave input signal, comprising:
   (a) a local oscillation circuit,
   (b) a diode which converts a frequency by using said microwave input signal and a local oscillation signal supplied from said local oscillation circuit,
   (c) a bias current supply terminal to which a bias control voltage is applied, said bias control voltage supplying bias current to said diode,
   (d) a detection terminal which detects a dc voltage generated at said diode, and
   (e) a bias supply circuit which controls said bias control voltage supplied to said bias current supply terminal responsive to a comparison of the detected dc voltage generated by said diode and a reference voltage.

2. The micro-wave mixing circuit of claim 1 wherein said bias supply circuit controls said bias control voltage so that the dc voltage detected by said detection terminal becomes a predetermined voltage.

3. A micro-wave mixing circuit for use with an input signal, comprising:
   (a) a micro-wave signal input part for receiving said input signal,
   (b) a local oscillation circuit,
   (c) a diode which converts a frequency by using said input signal fed into said micro-wave signal input part, an anode of said diode being coupled to a terminal of said micro-wave signal input part, and a cathode of said diode being grounded,
   (d) a bias current supply terminal which applies a bias current to the anode of said diode,
   (e) a detection terminal which detects a dc voltage generated at the anode of said diode, and
   (f) a bias supply circuit which applies a bias control voltage to said bias current supply terminal responsive to a comparison of the dc voltage detected by said detection terminal and a reference voltage.

4. A down flow converter for use with an input signal, comprising:
   (a) a micro-wave signal input part formed by a micro strip line,
   (b) a local oscillation circuit,
   (c) a diode having an anode which is coupled to a terminal of said micro strip line, and having a cathode which is grounded, said diode converting a frequency by using the input signal fed into said micro-wave signal input part and a local oscillation signal supplied from said local oscillation circuit,
   (d) a bias current supply terminal which supplies a bias current to the anode of said diode,
   (e) a detection terminal which detects a dc voltage generated at the anode, (f) a bias supply circuit which supplies bias current to said bias current supply terminal responsive to a comparison of the dc voltage generated at said detection terminal and a reference voltage.

5. A down flow converter for use with a micro-wave signal comprising:
(a) a probe which converts said micro-wave signal into a transverse electromagnetic wave,
(b) a low noise amplifier,
(c) a micro strip line coupled to said low noise amplifier,
(d) a diode coupled to of said micro strip line,
(e) a bias current supply terminal which supplies a bias current to said diode,
(f) a detection terminal which detects a dc voltage generated at said diode, and
(g) a bias supply circuit which supplies said bias current to said bias current supply terminal responsive to a comparison of the dc voltage generated at said detection terminal and a reference voltage.

6. A down flow converter for use with a micro-wave signal comprising:
(a) a probe which converts said micro-wave signal into a transverse electromagnetic wave,
(b) a low noise amplifier,
(c) a micro strip line coupled to said low noise amplifier,
(d) a diode having an anode coupled to said micro strip line, and a cathode which is grounded,
(e) a bias current supply terminal which supplies a bias current to the anode of said diode,
(f) a detection terminal which detects a dc voltage generated at the anode of said diode, and
(g) a bias supply circuit which supplies said bias current to said bias current supply terminal responsive to a comparison of the dc voltage generated at said detection terminal and a reference voltage.

* * * * *